United States Patent [19]

Lysinger

[11] Patent Number: 5,566,112
[45] Date of Patent: Oct. 15, 1996

[54] APPARATUS AND METHOD FOR ENABLING A BUS DRIVER WHEN A DATA SIGNAL IS VALID

[75] Inventor: Mark A. Lysinger, Carrollton, Tex.

[73] Assignee: SGS-Thomson Microelectronics, Inc., Carrollton, Tex.

[21] Appl. No.: 288,334

[22] Filed: Aug. 10, 1994

[51] Int. Cl.$^6$ ................................................ G11C 7/02
[52] U.S. Cl. .................. 365/196; 365/190; 365/189.05; 365/194; 365/233.5; 365/189.08; 326/86
[58] Field of Search ........................ 326/86, 90; 365/203, 365/190, 189.05, 194, 195, 233, 196, 233.5, 189.08

[56] References Cited

U.S. PATENT DOCUMENTS 4,760,291  7/1988  Nakajima et al. ..................... 326/86
5,210,715  5/1993  Houston ................................. 365/194
5,325,330  6/1994  Morgan ............................. 365/189.05
5,327,394  7/1994  Green et al. ........................ 365/233.5

Primary Examiner—David C. Nelms
Assistant Examiner—Andrew Q. Tran
Attorney, Agent, or Firm—David V. Carlson; Theodore E. Galanthay; Lisa K. Jorgenson

[57] ABSTRACT

An apparatus generates a bus-driver enable signal that enables a bus driver to couple a data signal from a sense amplifier to a data bus. A first circuit generates an equilibration pulse to equilibrate the sense amplifier, and a bus-driver enable circuit generates the bus-driver enable signal. A bus-driver disable circuit generates in response to the equilibration pulse a bus-driver disable signal for disabling the enable circuit at least until the data signal becomes valid.

10 Claims, 4 Drawing Sheets

APPARATUS AND METHOD FOR ENABLING A BUS DRIVER WHEN A DATA SIGNAL IS VALID

TECHNICAL FIELD

The invention relates generally to electronic devices and more specifically to a device for enabling a bus driver when a data signal output from a sense amplifier is valid.

BACKGROUND OF THE INVENTION

For advantages such as a increased speed, many static random access memories (SRAMs) store data in differential form, and use a sense amplifier to generate from the differential data a data signal that is suitable for coupling to a data bus. Typically, the sense amplifier converts the differential data into a single voltage or current whose level is measured with respect to a reference voltage (often ground) or current. Often, before the sense amp performs this conversion, a controller equilibrates it. That is, the controller calibrates the sense amp's differential inputs to equivalent voltage or current levels. After it performs this equilibration, the controller enables the sense amp to perform the data conversion. Once the sense amp is enabled, the controller enables a bus driver to couple the data signal onto the data bus.

A problem with such an SRAM is that it often couples the data signal to the data bus before it is valid, i.e., accurately representative of the stored data. Typically, after it has been enabled, the sense amplifier requires a settling period before its output data signal accurately represents the data value of its input. The length of this settling period often depends upon the SRAM and the application in which it is used. Thus, during this settling period, the data signal output by the sense amp may be invalid. If the controller enables the bus driver before the sense amp's settling period has expired, the bus driver may couple invalid data to the data bus.

SUMMARY OF THE INVENTION

In accordance with one aspect of the present invention, an apparatus generates a bus-driver enable signal that enables a bus driver to couple a data signal from a sense amplifier to a data bus. A first circuit generates an equilibration pulse to equilibrate the sense amplifier, and a bus-driver enable circuit generates the bus-driver enable signal. In response to the equilibration pulse, a bus-driver disable circuit generates a bus-driver disable signal for disabling the enable circuit at least until the data signal becomes valid.

In accordance with another aspect of the invention, a sense-amplifier enable signal is generated. The bus-driver enable signal is generated a selected time after the sense-amplifier enable signal is generated. The selected time has a duration sufficiently long to allow the data signal to become valid before it is coupled to the data bus.

An advantage provided by one aspect of the invention is that it enables the bus driver when the data signal from the sense amplifier is valid.

An advantage of another aspect of the present invention is that it provides a bus-driver disable signal having an active period whose duration is adjustable.

An advantage of yet another aspect of the invention is that it is suitable for implementation in an integrated circuit.

DETAILED DESCRIPTION OF THE INVENTION

Figure 1:
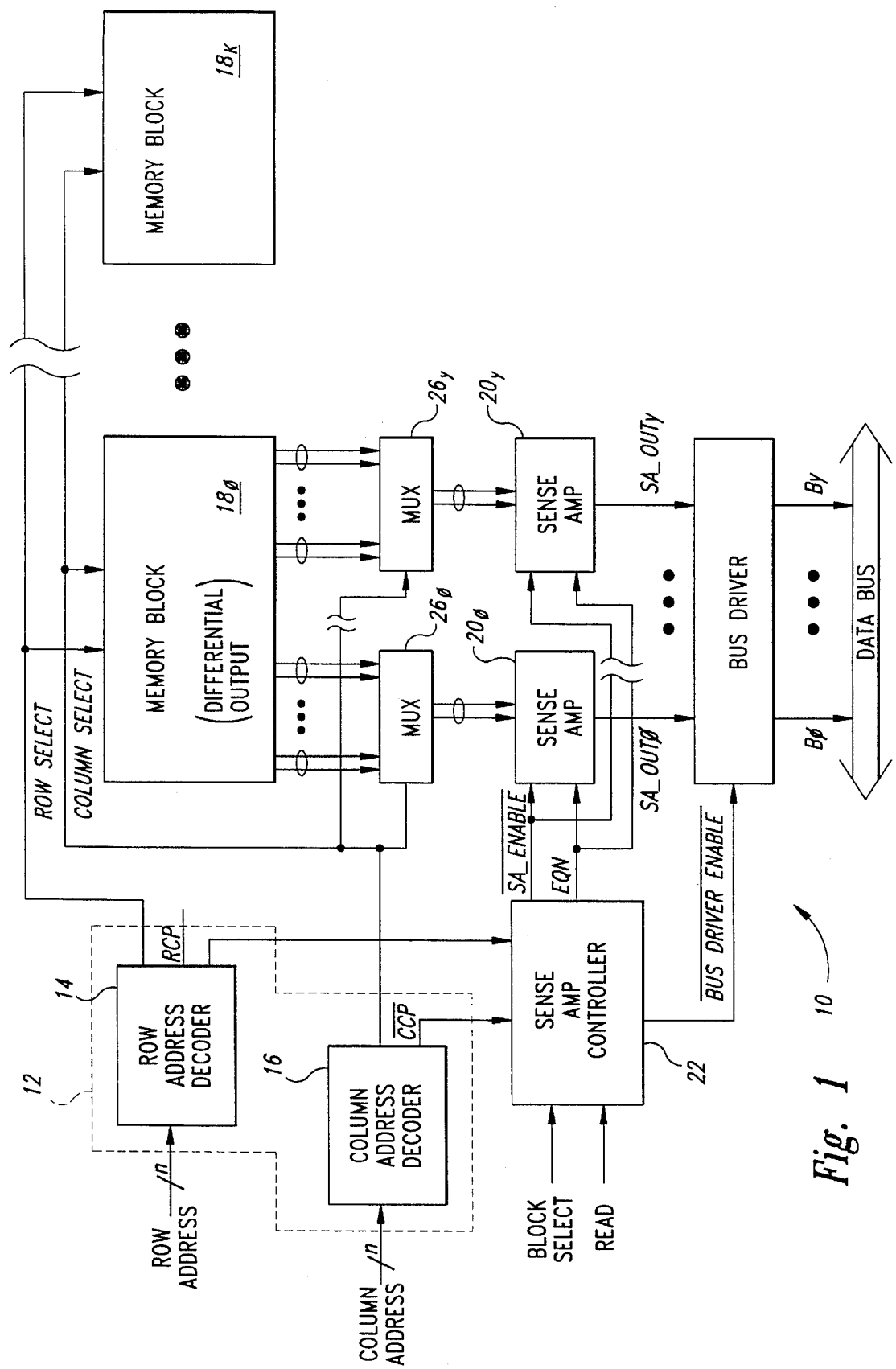
FIG. 1 is a block diagram of a portion of an SRAM formed according to the present invention.

FIG. 1 is a block diagram of an internal portion of an SRAM 10 formed according to the present invention. SRAM 10 includes an address decoder 12, which includes a row address decoder 14 and a column address decoder 16. Address decoder 12 decodes an n-bit row address and an n-bit column address to select the desired data location in one of memory blocks $18_0$–$18_k$. Once the decoder 12 selects the data location, the selected block 18 provides the data bit within that location to a corresponding one of sense amplifiers $20_0$–$20_y$. The corresponding sense amplifier 20 converts the data bit from differential form into a corresponding one of data signals SA_OUT0–SA_OUTy. A sense amplifier controller 22 enables sense amplifiers 20 so that they can output the data signals SA_OUT. However, before bus driver 24 can couple data signals SA_OUT onto the data bus, controller 22 enables the bus driver 24. Controller 22 does not generate a bus driver enable signal until a selected time after it has enabled sense amplifiers 20. This selected time is sufficient to allow data signals SA_OUT to become valid. Thus, by enabling the bus driver only when signals SA_OUT are valid, controller 22 prevents bus driver 24 from coupling invalid data to the data bus. As discussed below, the selected time may be adjustable, and controller 22 can be implemented in an integrated SRAM circuit.

Still referring to FIG. 1, SRAM 10 is discussed in more detail. Typically, a memory block 18 stores data bits in rows and columns. For purposes of example, memory block $18_0$ is discussed, it being understood that other memory blocks 18 have a similar structure and operation. In one aspect of the invention, memory block $18_0$ stores data in approximately sixty four columns. These sixty four columns (not shown) are divided into eight groups. Each of the eight columns within a group is coupled to a differential multiplexer $26_0$–$26_y$, where in the discussed aspect of the invention, y=7. Column address decoder 16 selects the input of multiplexer $26_0$ that corresponds to the selected column from memory block $18_0$. Multiplexer $26_0$ couples the data bit from its selected input to its output, which provides the data bit to the input of sense amplifier $20_0$.

Sense amplifier $20_0$ converts the differential data bit at its input to data signal SA_OUT0 at its output. For purposes of this discussion, it is understood that other sense amplifiers 20 have a similar structure and operation to those of sense amplifier $20_0$. Typically, memory blocks 18 store data in differential form to insulate the data bits from ground noise and to conserve power, as well as to provide other advantages. In one aspect of the invention, one of the differential data lines input to sense amplifier $20_0$ is driven to approximately the power supply voltage VCC while the other line is driven to approximately 500 millivolts below VCC. The states of the two input lines determine whether the data bit is a logic 1 or logic 0. Sense amplifier $20_0$ senses the state of each line, and converts the differential data signal into a data signal having a form and range compatible with the data bus. For example, sense amplifier $20_0$ may generate a differential or single-ended data signal where 0 volts is logic 0 and +5 volts is logic 1. Although specific voltage levels have been discussed, differential currents and other voltage levels may be used without departing from the spirit and scope of the invention.

Often, before controller 22 enables sense amplifier $20_0$, it generates an equilibration signal EQN to equilibrate sense amplifier $20_0$. This equilibration, which is performed using existing techniques, balances the two differential inputs of amplifier $20_0$, i.e., sets them at an equivalent voltage level to reduce or eliminate the likelihood of amplifier $20_0$ making a false reading of the differential input data. Equilibration is useful in systems where the differential voltages are small, like the 500 millivolt differential described above. After it equilibrates amplifier $20_0$, controller 22 generates signal $\overline{\text{SA-ENABLE}}$, which enables sense amplifier $20_0$ to generate data signal SA_OUT0. However, as described above, after controller 22 enables amplifier $20_0$, there is a period of time during which SA_OUT0 may be invalid, i.e., may be inaccurate due to reasons such as the settling time of amplifier $20_0$. If during this period bus driver 24 couples SA_OUT0 to the data bus as bit B0, B0 may be inaccurate and cause the system to read an erroneous data value. Therefore, to prevent such inaccuracies, controller 22 generates the bus-driver enable signal when SA_OUT0 becomes valid or at some time thereafter. For example, controller 22 may wait a predetermined time after the generation of either EQN or $\overline{\text{SA-ENABLE}}$ to generate the bus-driver enable signal. Thus, in contrast to existing SRAMs, SRAM 10 does not output data B0–By to the data bus until sense amplifiers 20 are generating valid data signals SA_OUT0–SA_OUTy. Furthermore, controller 22 can generate the desired bus-driver enable signal in circuits where the sense amplifiers are not equilibrated.

Figure 2:
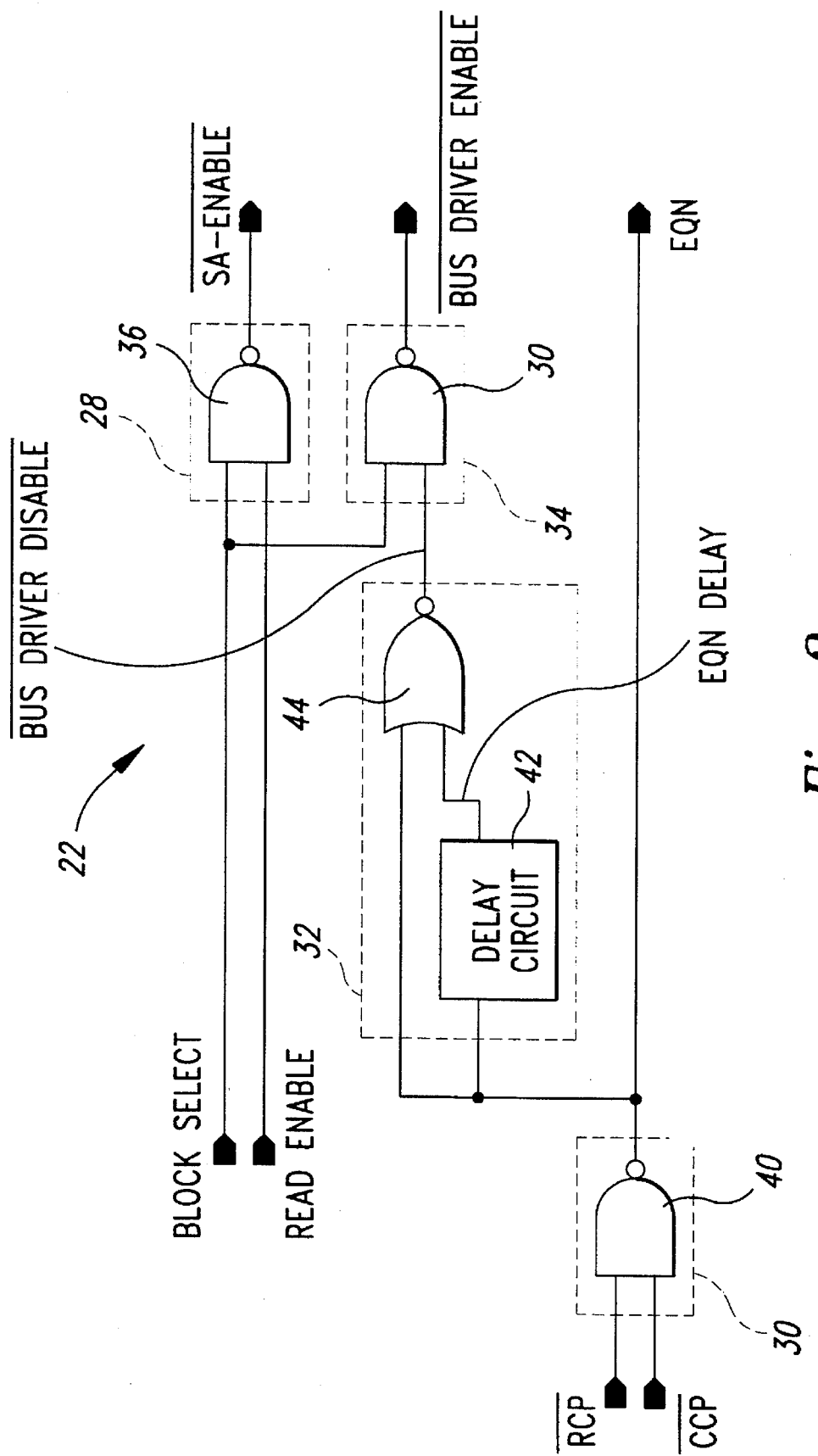
FIG. 2 is a schematic diagram of one embodiment of the sense-amplifier controller of FIG. 1.

FIG. 2 is a schematic diagram of sense amplifier controller 22 of FIG. 1. Controller 22 includes a sense-amplifier enable circuit 28, an equilibration pulse generator 30, a bus-driver disable circuit 32, and a bus-driver enable circuit 34. Enable circuit 28 generates $\overline{\text{SA-ENABLE}}$ when both BLOCK SELECT and READ ENABLE become active. Because BLOCK SELECT and READ ENABLE are active high, circuit 28 includes a NAND gate 36. Bus-driver enable circuit 34 generates BUS DRIVER ENABLE when BLOCK SELECT is active and when $\overline{\text{BUS DRIVER DISABLE}}$ is inactive. Because BLOCK SELECT is active high and $\overline{\text{BUS DRIVER ENABLE}}$ and $\overline{\text{BUS DRIVER DISABLE}}$ are active low, enable circuit 34 includes a NAND gate 38. Equilibration pulse generator 30 generates EQN when either the row cycle pulse ($\overline{\text{RCP}}$) from row address decoder 14 (FIG. 3) or the column cycle pulse ($\overline{\text{CCP}}$) from column address decoder 16 are pulsed. Because $\overline{\text{RCP}}$ and $\overline{\text{CCP}}$ are pulsed low and EQN is pulsed high, generator 30 includes a NAND gate 40.

Bus-driver disable signal generator 32 delays the trailing edge of EQN such that $\overline{\text{BUS DRIVER DISABLE}}$ becomes active before BLOCK SELECT becomes active, and remains active at least until data signals SA_OUT are valid. In one aspect of the invention, generator 32 includes a delay circuit 42 for generating EQN DELAY, and a NOR gate 44 for generating $\overline{\text{BUS DRIVER DISABLE}}$.

Figure 3:
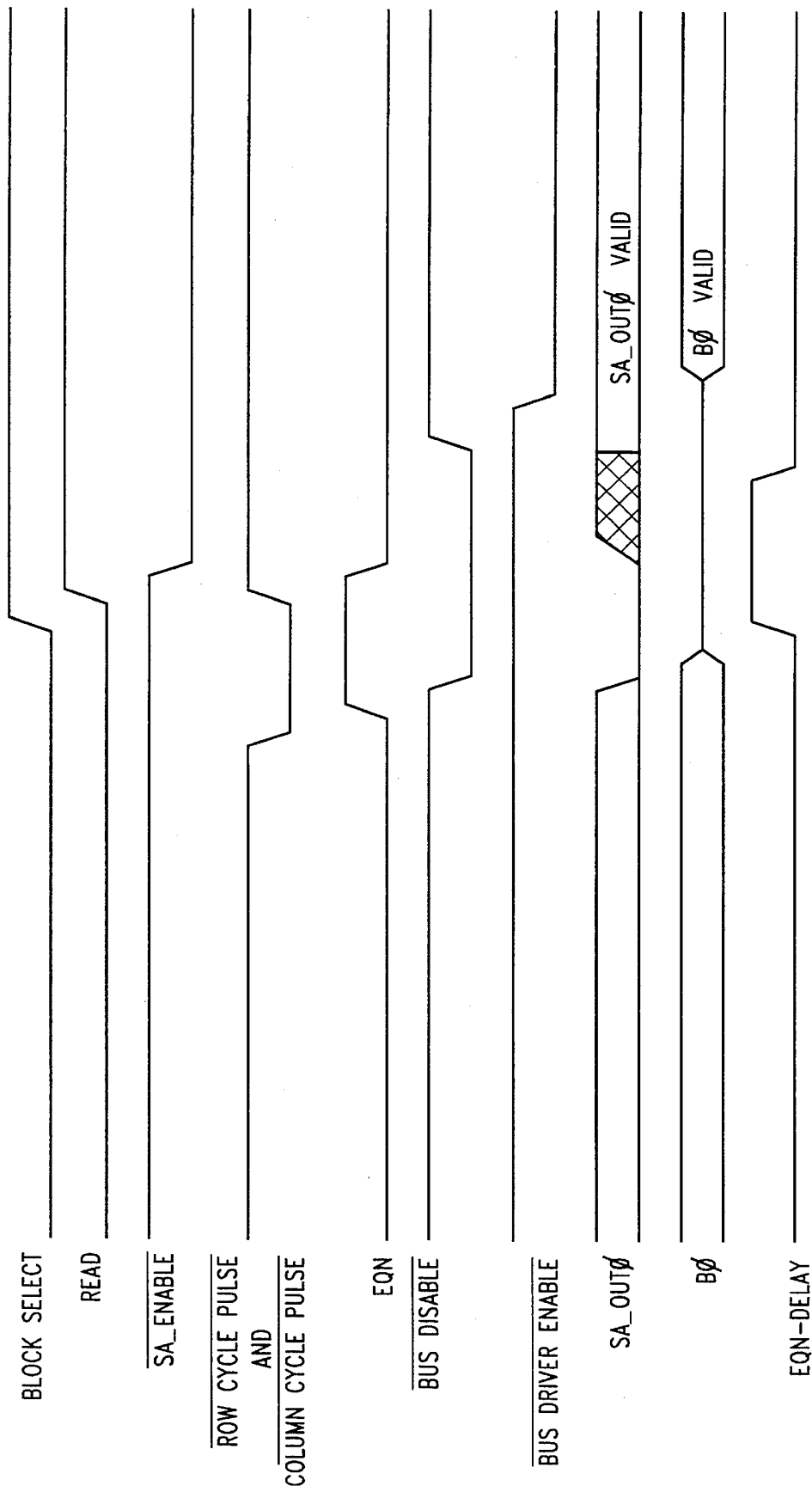
FIG. 3 is a diagram showing the relative timing of the signals associated with FIGS. 1 and 2.

In operation and referring to the timing diagram of FIG. 3, EQN transitions to a high level as it becomes active. Thus, one of the inputs to NOR gate 44 transitions high; this transition causes the output of NOR gate 44 to transition low, and thus causes $\overline{\text{BUS DRIVER DISABLE}}$ to become active. After a delay of a predetermined time, EQN DELAY also transitions high. In this aspect of the invention, EQN DELAY transitions active high before EQN transitions inactive low in order to ensure that $\overline{\text{BUS DRIVER DISABLE}}$ does not become inactive before data signals SA_OUT are valid. Thus, the delay that circuit 42 adds to the leading edge of EQN is typically less than the duration of EQN. EQN DELAY then remains active high for a predetermined time sufficient to allow data signals SA_OUT to become valid, and to maintain $\overline{\text{BUS DRIVER DISABLE}}$ active after EQN becomes inactive. After the predetermined time has elapsed, EQN DELAY becomes inactive, causing $\overline{\text{BUS DRIVER DISABLE}}$ to become inactive high. When $\overline{\text{BUS DRIVER DISABLE}}$ becomes inactive, circuit 34 generates $\overline{\text{BUS DRIVER ENABLE}}$ to allow bus driver 24 to couple the now-valid data signals SA_OUT from sense amplifiers 20 to the data bus as data bits B.

FIG. 3 is a timing diagram of the signals shown in FIGS. 1 and 2. As shown, either $\overline{\text{RCP}}$ or $\overline{\text{CCP}}$ transition low, as a result of an address transition, to indicate that the system has initiated a read or write cycle. Such a transition activates EQN, which in turn activates $\overline{\text{BUS DRIVER DISABLE}}$. Then, BLOCK SELECT and READ become active and activate $\overline{\text{SA-ENABLE}}$. However, although sense amplifiers 20 are enabled, data signals SA_OUT are invalid. Thus, as described above, EQN DELAY becomes active, and remains active even after EQN becomes inactive, to lengthen the active portion of $\overline{\text{BUS DRIVER DISABLE}}$ to a time at or beyond that at which signals SA_OUT become valid. When $\overline{\text{BUS DRIVER DISABLE}}$ becomes inactive, $\overline{\text{BUS DRIVER ENABLE}}$ becomes active and allows bus driver 24 to couple signals SA_OUT to the data bus as bits B. Thus, when active, $\overline{\text{BUS DRIVER DISABLE}}$ inhibits the generation of $\overline{\text{BUS DRIVER ENABLE}}$.

Figure 4:
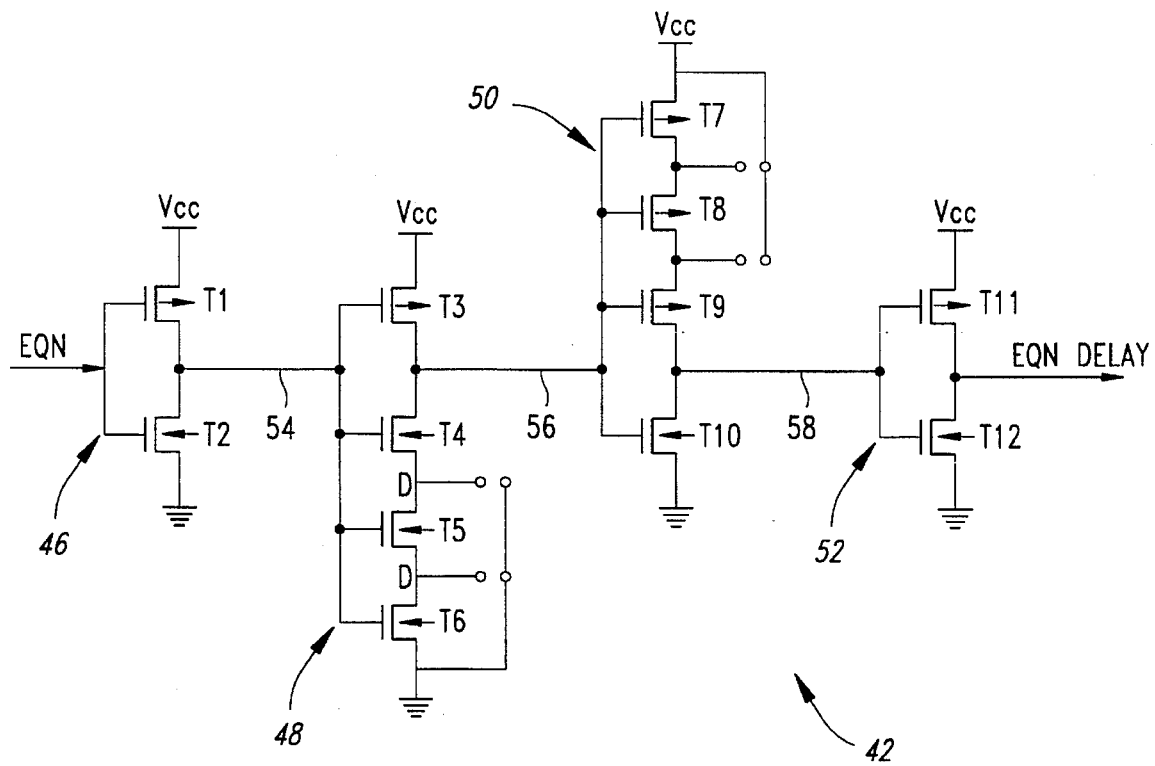
FIG. 4 is a schematic diagram of one embodiment of the delay circuit of FIG. 2.

FIG. 4 is a schematic diagram of one embodiment of delay circuit 42 of FIG. 2. Circuit 42 has four stages 46, 48, 50, and 52. Stage 46 includes a p-channel MOS transistor T1 and an n-channel MOS transistor T2 configured as an inverter. Stage 48 comprises a p-channel MOS transistor T3 and three n-channel MOS transistors T4–T6. As discussed below, the drain of T6, or the drains of both T5 and T6, may be shorted to ground in order to vary the trailing-edge delay applied to EQN to generate EQN DELAY. Stage 50 includes three p-channel transistors T7–T9, and an n-channel transistor T10. The drain of T7, or the drains of both T7 and T8, may be shorted to VCC in order to vary the delay that stage 50 imparts to the trailing edge of EQN. Stage 52 includes a p-channel MOS transistor T11 and an n-channel MOS transistor T12 configured as an inverter that is similar in structure and operation to stage 46.

In operation, as EQN transitions high, T1 switches off and T2 switches on to drive line 54 to approximately ground or zero volts. The low voltage level on line 54 switches off T4, T5 and T6 and switches on T3 to drive line 56 to approximately VCC. The high voltage level on line 56 switches off T7–T9 and switches on T10 to drive line 58 to approximately zero volts. The low voltage level on line 58 switches off T12 and switches on T11 to generate EQN DELAY having an active high level. Thus, circuit 42 delays the leading edge of EQN by the channel delays of T2, T3, T10 and T11. In one aspect of the invention, each transistor T has a channel delay of approximately one nanosecond. Thus, in such an embodiment, circuit 42 delays the leading edge of EQN by approximately four nanoseconds. In such an embodiment, EQN has a duration that is greater than four nanoseconds for the reasons discussed above.

As EQN transitions to its low inactive state, T2 switches off and T1 switches on to drive line 54 to VCC. The high voltage level on line 54 switches off T3 and switches on T4 and those of T5 and T6 not having their drains effectively shorted to ground to drive line 56 low. For example, if both T5 and T6 have their drains shorted to ground, then only T4 is switched on. If only the drain of T6 is shorted to ground, then both transistors T4 and T5 are switched on. Likewise, if neither T5 nor T6 have their drains shorted to ground, then T4–T6 are switched on. Because only active transistors impart a channel delay, one can easily configure stage 48 to impart either a 1-, 2-, or 3-channel delay to the trailing edge of EQN. The low voltage level on line 56 switches off T10 and switches on T9 and those of T7 and T8 not having their drains shorted to VCC to drive line 58 high. In a similar manner as described above for stage 48, one may easily configure stage 50 to impart either a 1-, 2-, or 3-channel delay to the trailing edge of EQN. The voltage level of approximately VCC on line 58 switches off T11 and switches on T12. Thus, circuit 42 selectively imparts a 4- to 8-channel delay to the trailing edge of EQN. When implemented as an integrated circuit, the drains of the transistors selected from T5–T8 may be shorted to ground and VCC, respectively, by existing semiconductor methods.

A user, the manufacturer, or the designer of the circuit, can select the amount of delay desired for the trailing edge of EQN and can then short to ground the proper number of transistors to achieve the selected delay. This selection of the delay time can be as a result of computer simulation, tests in silicon, or any other technique. Generally, the delay is selected for a given chip and the mask altered to short across the correct transistors so that all chips of that circuit design have the desired delay in mass production quantities.

Delay circuit 42 may include other types of circuit structures as well. For example, circuit 42 may comprise a plurality of diodes or transistors that can be selectively coupled as described above to form serial delay chains. Or, transistors with different channel widths may allow a choice of delay elements with varying channel delays.

Figure 5:
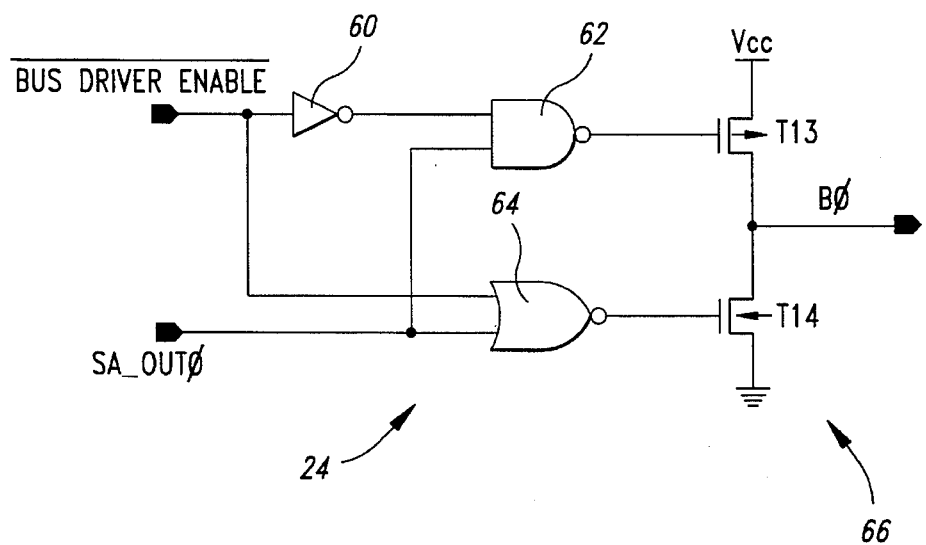
FIG. 5 is a schematic diagram of one embodiment of the bus driver of FIG. 1.

FIG. 5 is a schematic diagram of one embodiment of bus driver 24 of FIG. 1. Only the circuitry associated with data bit B0 is shown, it being understood that the circuits associated with the other bits B have a similar structure and operation. Bus driver 24 includes an inverter 60, a NAND gate 62, and a NOR gate 64, as well as an output buffer stage 66 that includes a p-channel transistor T13 and an n-channel transistor T 14 arranged in a push-pull configuration as shown.

In operation, when $\overline{\text{BUS DRIVER ENABLE}}$ is inactive high, a low signal is applied to one input of NAND gate 62, and a high signal is applied to one input of NOR gate 64. The low signal effectively disables NAND gate 62 by forcing its output high regardless of the second input, SA_OUT0. Likewise, the high signal effectively disables NOR gate 64 by forcing its output to be low regardless of the value of SA_OUT0. The high signal output by NAND gate 62 and the low signal output by NOR gate 64 respectively maintain T13 and T14 in off states. Thus, buffer 66 maintains B0 is in a high impedance state.

When $\overline{\text{BUS DRIVER ENABLE}}$ becomes active low, a high signal is applied to one input of NAND gate 62 and a low signal is applied to one input of NOR gate 64 to enable these gates. Thus, when SA_OUT0 is a logic 1, the output of NAND gate 62 is a logic 0, which switches on T13 to drive B0 to a logic 1. At the same time, the output of NOR gate 64 is driven low to switch off T14. Conversely, when SA_OUT0 is a logic 0, the output of NOR gate 64 is a logic 1, which switches on T4 to drive B0 to a logic 0. At the same time, the output of NAND gate 62 is driven high to switch off T13. Thus, when $\overline{\text{BUS DRIVER ENABLE}}$ is active, B0 has the same value as SA_OUT0.

It will be appreciated that, although various embodiments of the invention have been described herein for purposes of illustration, modifications may be made without departing from the spirit and scope of the invention. Accordingly, the invention is not limited except as by the appended claims.

I claim:

1. Apparatus for generating a bus-driver enable signal that enables a bus driver to couple a data signal from a sense amplifier to a data bus, said sense amplifier coupled to receive a sense-amplifier enable signal, said apparatus comprising:

a first circuit that is operable to generate an equilibration signal to equilibrate said sense amplifier;

a bus-driver enable circuit that is coupled to said bus driver, operable to generate said bus-driver enable signal, and lacks a component input terminal that is directly connected to said equilibration signal; and a bus-driver disable circuit that is coupled between said first circuit and said bus-driver enable circuit, has a pair of component input terminals, and is connected to receive said equilibration signal at said pair of input terminals and only at said pair of input terminals, said bus-driver disable circuit operable to receive said equilibration signal, and operable to generate in response to said equilibration signal a bus-driver disable signal that prohibits said bus-driver enable circuit from generating said bus-driver enable signal for a first predetermined time after said sense-amplifier enable signal enables said sense amplifier.

2. The apparatus of claim 1, further comprising:

an address decoder that is coupled to said first circuit and is operable to generate an address cycle signal; and wherein said first circuit is operable to generate said equilibration signal from said address cycle signal.

3. The apparatus of claim 1 wherein said bus-driver enable circuit is operable to receive a memory-block select signal and to generate said bus-driver enable signal as a logical combination of said memory-block select signal and said bus-driver disable signal.

4. The apparatus of claim 3 wherein said bus-driver enable circuit comprises a NAND gate that has a pair of inputs that are coupled to respectively receive said bus-driver disable signal and said memory-block select signal, and that has an output that is coupled to provide said bus-driver enable signal.

5. The apparatus of claim 1 wherein said bus-driver disable circuit comprises:

a delay circuit that is coupled to receive said equilibration signal from said first circuit and that is operable to delay said equilibration signal by a second predetermined time to generate a delayed equilibration signal; and a NOR gate that has a first input coupled to receive said equilibration signal from said first circuit, a second input coupled to receive said delayed equilibration signal from said delay circuit, and an output coupled to provide said bus-driver disable signal to said bus-driver enable circuit.

6. A method for enabling a bus driver to couple a data signal generated by a sense amplifier to a data bus, said method comprising:

generating and coupling to said sense amplifier a sense-amplifier equilibrate signal;

delaying said sense-amplifier equilibrate signal to generate a delayed equilibrate signal and logically combining said sense-amplifier equilibrate signal and said delayed equilibrate signal to generate a bus-driver disable signal with a first circuit that has a pair and only said pair of component input terminals coupled to receive said sense-amplifier equilibrate signal;

generating and coupling to said sense amplifier a sense-amplifier enable signal; and generating from said bus-driver disable signal with a second circuit that lacks a direct signal connection to said sense-amplifier equilibrate signal a bus-driver enable signal a first predetermined time after generating said sense-amplifier enable signal, said first predetermined time having a duration sufficient to allow said data signal to become valid before said bus driver couples said data signal to said data bus.

7. The method of claim 6 wherein said generating said bus-driver enable signal comprises NANDing said bus-driver disable signal with a memory-block select signal to generate said bus-driver enable signal.

8. The method of claim 6 wherein said generating said sense-amplifier equilibration signal comprises:

generating an address cycle signal with an address decoder; and generating said sense-amplifier equilibration signal from said address cycle signal.

9. The method of claim 6 wherein said generating said bus-driver enable signal comprises generating said bus-driver enable signal as a logical combination of a memory-block select signal and said bus-driver disable signal.

10. The method of claim 6 wherein said delaying and logically combining comprise:

delaying said sense-amplifier equilibration signal by a second predetermined time to generate said delayed equilibration signal; and NORing said sense-amplifier equilibration signal and said delayed equilibration signal to generate said bus-driver disable signal.

* * * * *